United States Patent [19]
Ohkuma

[11] Patent Number: 5,180,990
[45] Date of Patent: Jan. 19, 1993

[54] EQUALIZER CIRCUIT, HIGH FIDELITY REGENERATIVE AMPLIFIER INCLUDING EQUALIZER CIRCUIT AND ACOUSTIC CHARACTERISTIC CORRECTION CIRCUIT IN HIGH FIDELITY REGENERATIVE AMPLIFIER

[76] Inventor: Saburoh Ohkuma, 2-20-8, Nan-yodai, Hachioji-shi, Tokyo, Japan

[21] Appl. No.: 747,649

[22] Filed: Aug. 20, 1991

[51] Int. Cl.$^5$ .............................. H03F 3/181
[52] U.S. Cl. .................. 330/304; 333/28 R; 381/97; 381/98
[58] Field of Search ............ 330/304; 333/28 R; 381/86, 97, 98, 103

[56] References Cited
FOREIGN PATENT DOCUMENTS
281799 12/1986 Japan ........................... 381/97

Primary Examiner—James B. Mullins
Attorney, Agent, or Firm—Koda and Androlia

[57] ABSTRACT

An equalizer circuit having a medium and high frequency correction circuits having a characteristics that a phase of an input aural signal advances as a frequency of the aural signal is increased in a higher frequency range than the 1 KHz and a circuit constant which advances a phase of the frequency from about 1 KHz to 5 KHz relatively and a low frequency correction circuit having a characteristic that a phase of the input aural signal is delayed as the frequency of the aural signal is lowered in a lower frequency range than about 1 KHz and a circuit constant having a reverse characteristic to a peak of a resonance frequency of the sound field to be regenerated.

3 Claims, 12 Drawing Sheets

EQUALIZER CIRCUIT, HIGH FIDELITY REGENERATIVE AMPLIFIER INCLUDING EQUALIZER CIRCUIT AND ACOUSTIC CHARACTERISTIC CORRECTION CIRCUIT IN HIGH FIDELITY REGENERATIVE AMPLIFIER

BACKGROUND OF THE INVENTION

1. Field of the Invention

The present invention relates to an acoustic circuit for correcting a frequency characteristic and a phase characteristic of regenerated sound to an optimal state so that the regenerated sound is obtained in a state extremely near to original sound in a sound field for regeneration.

2. Description of the Prior Art

Recently, an amplifier called an audio amplifier capable of regenerating sound with high fidelity is generally used.

The audio amplifier is required to regenerate sound with high fidelity and accordingly a frequency characteristic thereof is adapted to be flat over as a wide frequency range as possible.

A frequency characteristic of a common audio amplifier is substantially flat from about 30 Hz to about 10 KHz while the frequency characteristic is lower with decrease or increase of the frequency in a frequency range other than the above frequency range. Further, the audio amplifier has a phase characteristic that a phase is gradually delayed with increase of the frequency.

In an audio amplifier, heretofore, the quality of regenerated sound has been improved. The improvement of the sound quality is achieved by an equalizer amplifier or the like to attain a flat frequency characteristic in a sound field. However, it has been found recently that it is desirable that a phase characteristic be flat over the entire frequency range as well as the flat frequency characteristic in other to realize higher quality sound.

However, heretofore, an improvement for the phase characteristic which is corrected to be flat over the all frequency range in the audio amplifier is not quite made and accordingly the conventional audio amplifier has a limit to improvement of the quality of regenerated sound. Further, when an amplification in a ultra-low or ultra-high frequency range is to be made in a relation to phase shift, an oscillation may occur in the ultra-low or ultra-high frequency range. Even in this point, there is a limit to improvement of the quality of regenerated sound.

On the other hand, an audio amplifier for an automobile having a room forming a sound field includes an equalizer circuit capable of correcting the sound field characteristic peculiar to the room of the automobile and correcting the sound quality and a frequency characteristic of regenerated sound so that the regenerated sound by the amplifier is obtained in the state near to original sound so that music can be heard in a relatively good condition even in the room of the automobile where the acoustic conditions are not so good.

However, with such a conventional equalizer circuit, since the frequency characteristic can be made flat but the phase characteristic is not taken into consideration, the regenerated sound is very unsatisfactory.

More particularly, in the equalizer circuit, when a single sound of a sine wave is employed and its frequency is gradually increased or decreased so that a phase characteristic of the equalizer circuit is measured by a measuring apparatus, there can be obtained a phase characteristic having no variation over substantially all frequency range apparently. However, since the phase characteristic is obtained as a result of a combination of phase characteristics of a low pass filter, a band pass filter and a high pass filter, a phase distortion occurs due to a phase difference in a frequency range in which phases of each of the filters are overlapped to thereby cause deterioration and impurity of the quality of sound and indefiniteness of orientation of the acoustic sound. The phase distortion is particularly large at an overlap point of the frequency characteristic curves of the filters, that is, in the vicinity of a dip point. This is caused by the fact that the equalizer circuit includes a feedback circuit.

As described above, the improvement of the sound quality in the prior art resides in the realization of the flat frequency characteristic in the sound field. However, when higher sound quality is required, the phase distortion can not be neglected as described above.

The phase of regenerated sound is an important improvement item for eliminating the phase distortion since it is an important element to the orientation of the acoustic image when excellent sound in the psychological aspect which is not measured by any measuring apparatus, directly speaking, natural sound, such as sound having presence or transparency, or sound which does not give fatigue even if listening to the sound for a long time is pursued.

SUMMARY OF THE INVENTION

The present invention is basically directed to an equalizer circuit capable of regenerating natural sound without phase distortion by a relatively simple circuit configuration.

In a first basic invention, the equalizer circuit for correcting the quality and a frequency characteristic of regenerated sound so that the regenerated in various sound fields sound can be obtained in a state near to original sound, comprises a medium frequency and high frequency correction circuits having a characteristic that a phase of an input aural signal advances as a frequency of the aural signal is increased in a higher frequency range than the vicinity of 1 KHz and a resistor and an inductor connected in series or parallel having a circuit constant which advances a phase of the frequency from about 1 KHz to 5 KHz relatively in order to attain far and near feeling, and a low frequency correction circuit having a characteristic that a phase of the input aural signal is delayed as the frequency of the aural signal is low in a lower frequency range than 1 KHz and a resistor and an inductor connected in parallel or series and having a circuit constant having a reverse characteristic to a peak of a resonance frequency of the sound field to be regenerated, the medium, high and low frequency correction circuits being connected one another.

Further, the present invention is directed to a high fidelity regenerative amplifier provided with the equalizer circuit which attains a flat phase characteristic and a flat output level over a wide frequency range in addition to the correction of the phase distortion.

The second invention is characterized by the provision of an amplifier circuit for amplifying regenerated sound with high fidelity, a phase correction circuit connected to an input of the amplifier to correct a phase characteristic of the amplifier over the wide frequency range, and the equalizer circuit of the basic invention connected to an input and/or an output of the phase correction circuit.

Further, the present invention is directed to an acoustic characteristic correction circuit capable of exhibiting the acoustic characteristic in the low and high frequency ranges sufficiently in addition to the correction of the phase distortion.

The third invention is characterized by the provision of an impedance conversion circuit connected to an input and/or an output of the basic equalizer circuit to convert an impedance of the basic equalizer circuit. In the third invention, each of the medium, high and low frequency correction circuits include a resistor and a condenser.

All of the above-described inventions can eliminate the phase distortion, clarify the front and rear relation of sound sources and bring the regenerated sound close to more natural sound as compared with the conventional method.

DETAILED DESCRIPTION OF THE INVENTION

FIGS. 1 to 4 show an embodiment of an equalizer circuit according to a first invention.

Figure 1:
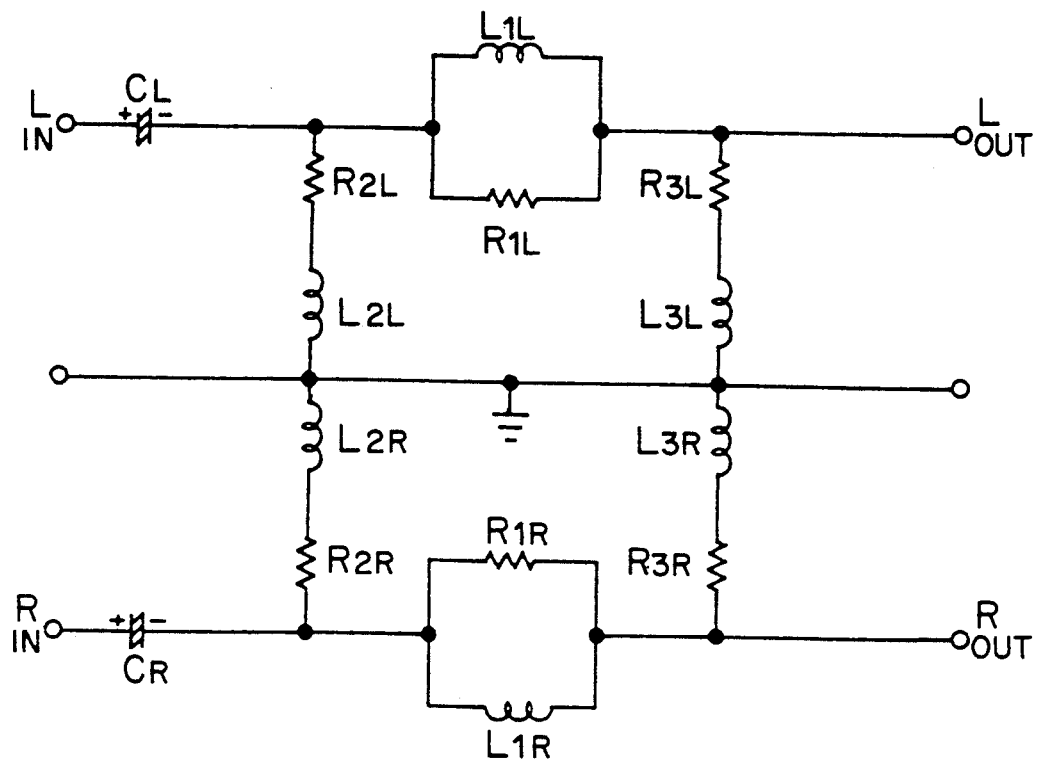
FIG. 1 is a schematic circuit diagram of an equalizer circuit according to a first invention.
Figure 2:
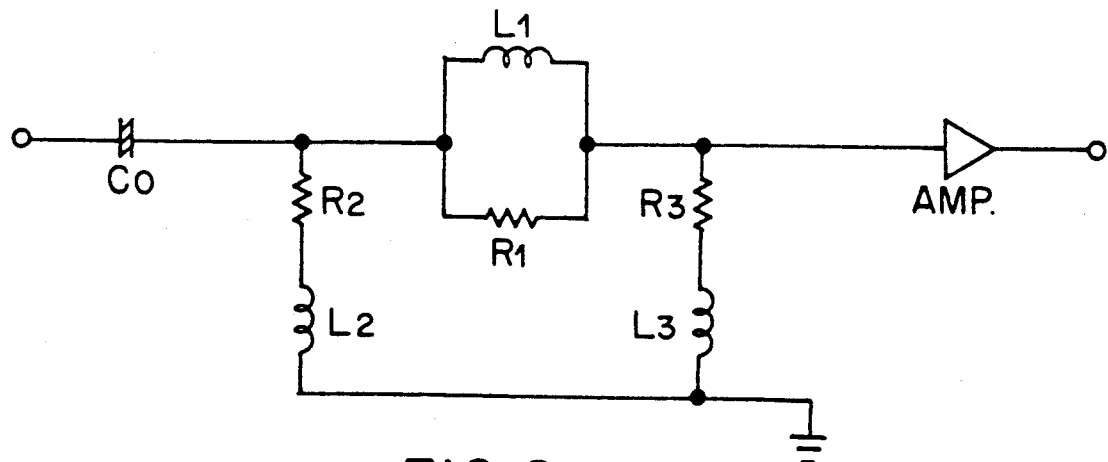
FIG. 2 is a schematic circuit diagram showing only one side of the equalizer circuit shown in FIG. 1.

FIG. 1 shows a circuit configuration thereof and this circuit includes resistors and inductors as shown in FIG. 1. A series circuit of a series connection of a resistor $R_{2L}$ and an inductor $L_{2L}$ and a series connection of a resistor $R_{3L}$ and an inductor $L_{3L}$ constitutes a left-hand high pass filter and a series circuit of a series connection of an inductor $L_{2R}$ and a resistor $R_{2R}$ a series connection of an inductor $L_{3R}$ and a resistor $R_{3R}$ constitutes a right-hand high pass filter. A parallel circuit of an inductor $L_{1L}$ and a resistor $R_{1L}$ constitutes a left-hand low pass filter and a parallel circuit of an inductor $L_{1R}$ and a resistor $R_{1R}$ constitutes a right-hand low pass filter. Only one side of the circuit of FIG. 1 is equivalently shown in FIG. 2. Of these resistors R and inductors L, the resistor $R_1$ and the inductor $L_1$ constitutes a low frequency correction circuit, the resistor $R_2$ and the inductor $L_2$ constitutes a medium frequency correction circuit, and the resistor $R_3$ and the inductor $L_3$ constitutes a high frequency correction circuit. The high pass filter and the low pass filter are connected to each other and an end of the high pass filter is connected to ground.

In the equalizer circuit of the embodiment, it is very important to determine constants of the constituent elements.

Figure 3:
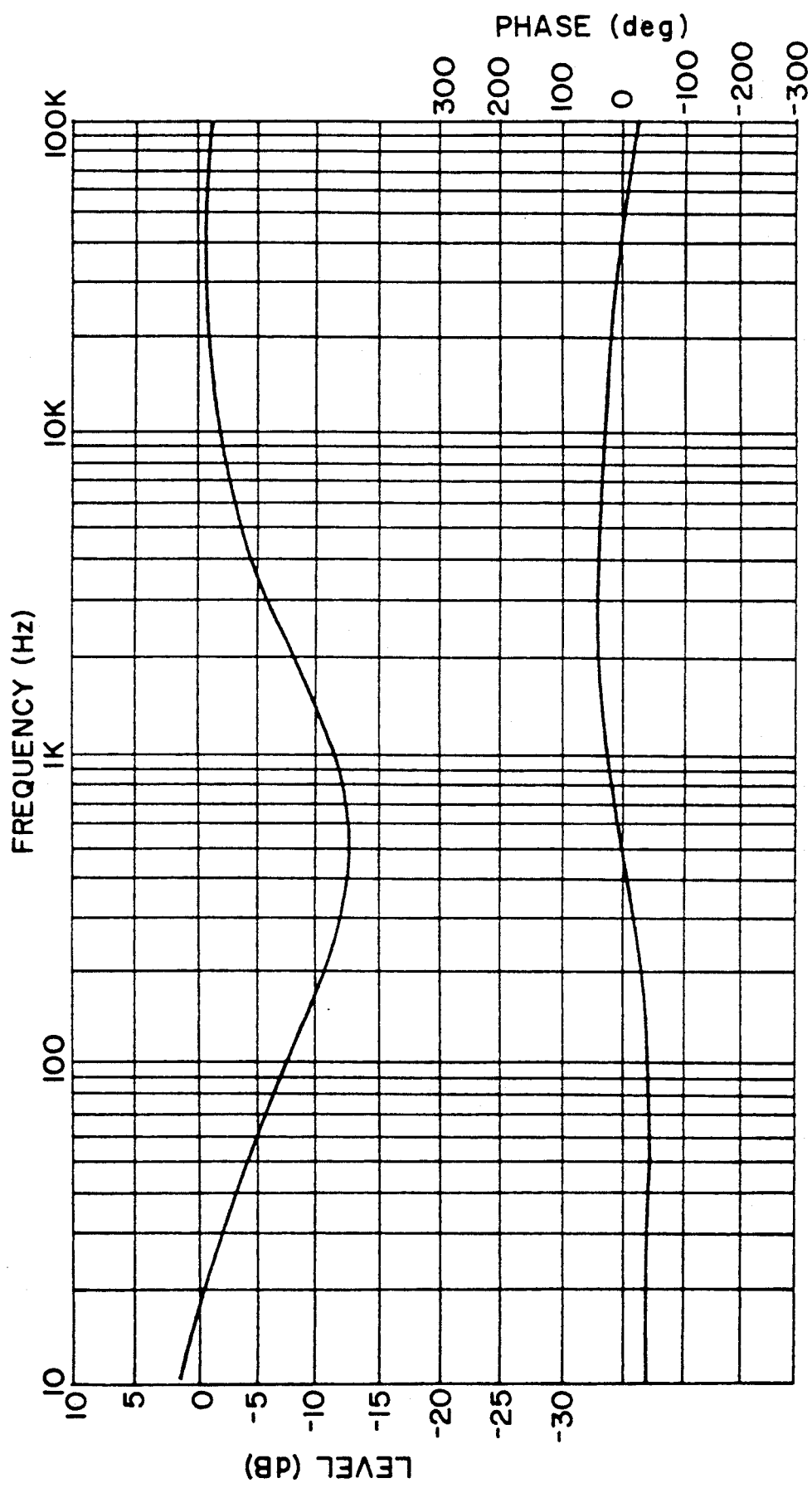
FIG. 3 is a characteristic diagram of the equalizer circuit according to the first invention.

More particularly, it is ideal that the dip point described above is set to substantially match a resonance frequency of a room or an automobile room constituting a sound field. However, the equalizer circuit of the embodiment has the phase characteristic and the frequency characteristic which are changed very smoothly and accordingly very severe setting is not neccessary. The phase characteristic in the frequency range lower than the dip point is set to tend to lag and the level is set to be increased as the frequency is descreased. With the setting, the orientation feeling in the right and left direction is improved so that sound is given solemn feeling. In the frequency range larger than the frequency at the dip point and less than 5 KHz, the phase characteristic is set to tend to lead and the level of the frequency characteristic is set to be increased. With the setting, the orientation feeling in the front and rear direction is improved. Since the frequency range from 5 KHz to the vicinity of 12 KHz is a frequency range in which abundance of musicality is affected, the phase characteristic is set to tend to lead and the frequency characteristic is set to be increased in the same manner as above. The frequency range larger than 12 KHz is an important frequency range for improvement of the atmosphere and to create a more natural sound and is a frequency range necessary for removing psychological sense of oppression as if a head were suppressed. Further, in the vicinity of the dip point, the characteristic is set to a reverse characteristic to a peak of a resonance frequency of the regenerated sound field, such as, for example a room of an automobile. Accordingly, it is necessary to set the constants so that the characteristics required for each of the frequency ranges are satisfied. FIG. 3 shows an example of the characteristics, which satisfy the characteristics required for each of the frequency ranges.

In the implementation of the circuit, it is necessary to pay attention so that the inductors are not coupled with each other and pay attention to various induction. Further, it is also necessary to pay attention to the frequency characteristic and the self-resonance frequency of the inductors themselves.

The various equalizer circuits shown in the embodiment are different from the conventional complicated circuit having filters having various characteristics and connected in series and are open loop circuits configured very simply. Accordingly, it is characterized in that occurrence of the phase distortion is very small and there is no sound shift even if a momentary large dynamic sound is produced from a percussion instrument is regenerated.

As a result that the equalizer circuit of the present invention has been operated actually, features in the psychological aspect which can not be measured by a measuring apparatus are as follows:

(a) Since the phase distortion is small, even if sound having, for example, the same frequency and different sound quality is regenerated, the orientation feeling of the acoustic image is improved extremely as compared with the conventional method.

More particularly, even if a violin and a piano produce sounds having the same frequency at the same time, the mutual positional relation (front and rear, and right and left) of the violin and the piano is defined exactly.

(b) Sound is very clear. In other words, it is a feeling that a film is removed. This is a matter of course since the phase distortion is decreased. Specifically, sound produced by drawing or rubbing a string can be heard well.

(c) Sound having the presence is produced. More particularly, there is a feeling of the immediate vicinity near the speaker or player. This is considered to be the synergism by improvement of the orientation feeling. More particularly speaking of the presence, near sound source is heard to be positioned in front of a loudspeaker and far sound source is heard to be positioned at the back of the loudspeaker. Further, the azimuth angle of the sound source in the right and left direction is realized so that the sound source is wider or narrower than the azimuth angle of the loudspeaker. Thus, it is near to an image of the regeneration of original sound field rather than an image of the regeneration of original sound.

(d) It is sound which does not give fatigue even if listening to the sound for a long time. This is considered to be achieved by the fact that the phase distortion is extremely reduced so that regenerated sound is brought close to natural sound. This psychological effect is specifically important for an audio system of a car.

(e) Even when listening to sound in a room of an automobile, it feels as if listening to the sound in a large hall and there is no oppression as if a head is suppressed. This is also considered to be achieved by the fact that the orientation feeling is improved and a position of the acoustic sound is clear by coupling a level up of the frequency range higher that 12 KHz with the advanced phase.

(f) By controlling volume by a volume controller, it is heard so that the whole of the acoustic image is near and far. More particularly, when the volume is decreased, it feels as if the musical performance is made far, while when the volume is increased, it feels as if the musical performance is made near.

(g) So-called vibration sound generated in a saturation of an output of an amplifier is reduced or quite removed.

Figure 4:
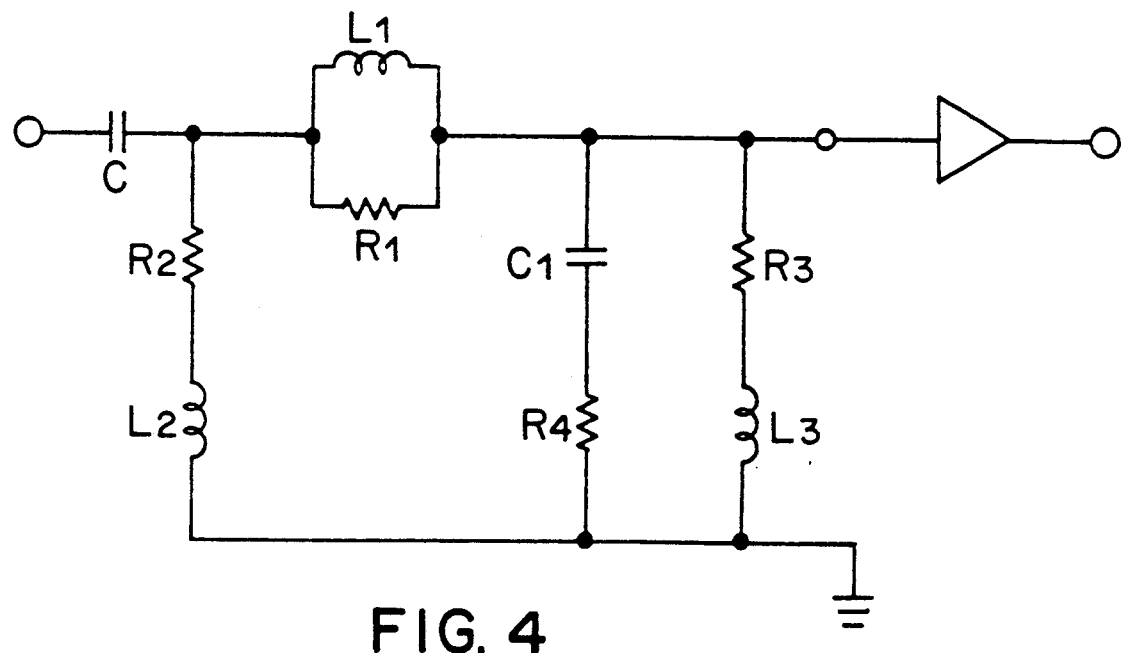
FIG. 4 is a schematic circuit diagram showing another example of an equalizer circuit.

FIG. 4 shows one side of another circuit configuration of the equalizer circuit equivalently. This circuit includes a series circuit of a condenser C and a resistor R supplementarily in addition to the circuit constituted of the resistors R and the inductors L. Such a circuit configuration can obtain the same effects as above.

FIGS. 5 to 10 show an embodiment of a high fidelity regenerative amplifier according to a second invention.

Figure 5:
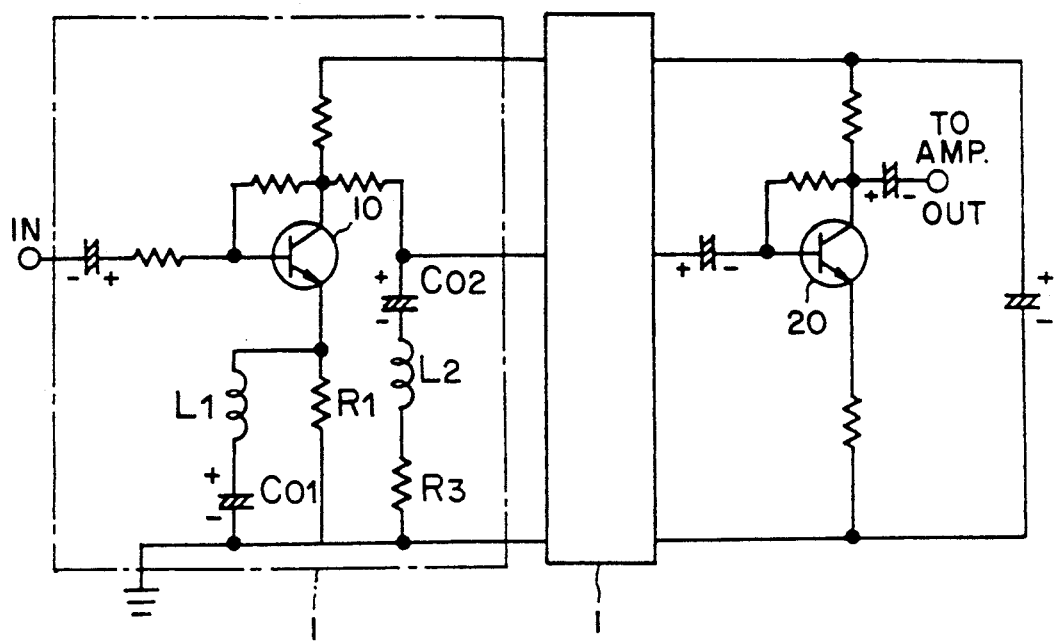
FIG. 5 is a circuit diagram of a phase correction circuit constituting a high fidelity regenerative amplifier with an equalizer circuit according to a second invention.

FIG. 5 shows a phase correction circuit constituting the high fidelity regenerative amplifier. The circuit of FIG. 5 is constituted of transistors and includes two phase correcting circuits 1 connected in series.

In the phase correction circuit, a parallel circuit of an inductor $L_1$ and a resistor $R_1$ connected to an emitter of a transistor 10 constitutes a low pass filter and a series circuit of an inductor $L_2$ and a resistor $R_3$ connected to a collector of the transistor 10 constitutes a high pass filter. It is a matter of course that constants of the circuit elements constituting the filters are determined to compensate for the phase characteristic of the amplifier. Condensers $C_{01}$ and $C_{02}$ serve to block dc current to the inductors $L_1$ and $L_2$. It is necessary that resonance frequencies by the inductor $L_1$ and the condenser $C_{01}$ and by the inductor $L_2$ and the condenser $C_{02}$ are set to be outside the frequency range to be used.

The circuit constituted in the same manner as described above is connected in series to an output of the above phase correction circuit and an output thereof is amplified by a transistor 20 to be supplied to an input of the amplifier. Accordingly, the phase characteristic of aural signal produced from the amplifier is flat over a very wide frequency range and the frequency characteristic is also flat over a very wide frequency range.

Figure 6:
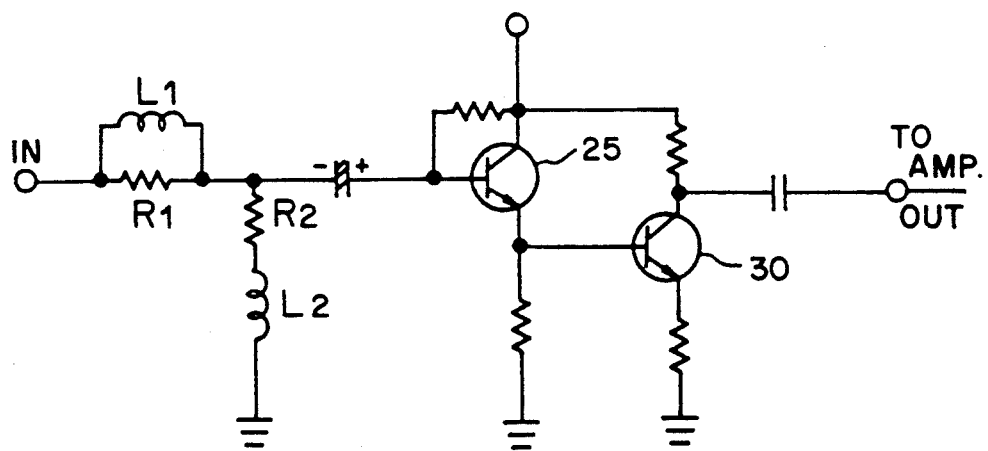
FIG. 6 is a circuit diagram of another phase correction circuit.

FIG. 6 shows a phase correction circuit having another circuit configuration. This circuit is also constituted of transistors. In this circuit, a parallel circuit of a resistor $R_1$ and an inductor $L_1$ constitutes a low pass filter and a series circuit of an inductor $L_2$ and a resistor $R_2$ constitutes a high pass filter. An aural signal passing through the filters is amplified by transistors 25 and 30 and supplied to the amplifier. In this case, constants of constituent elements constituting the filters are determined to compensate for the phase characteristic of the amplifier. Accordingly, the phase characteristic of aural signal produced from the amplifier is flat over a very wide frequency range and the frequency characteristic is also flat over the very wide frequency range.

Figure 7:
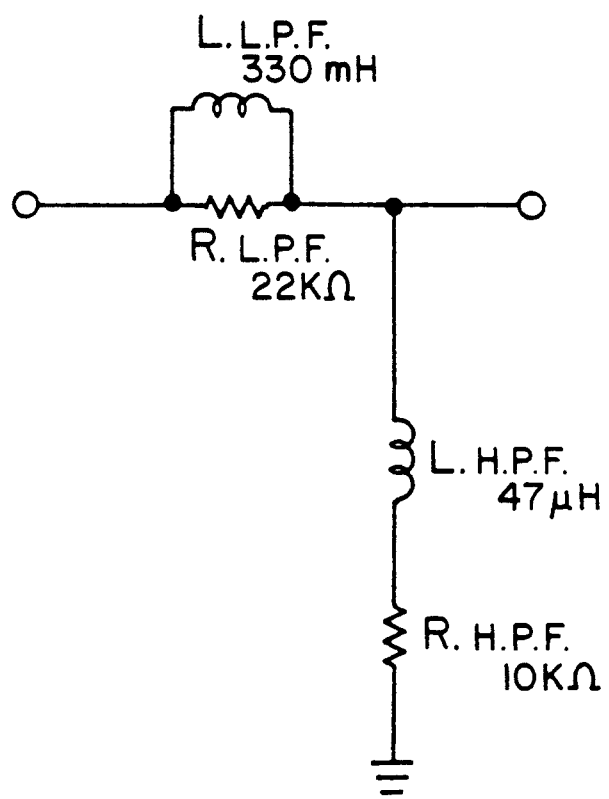
FIG. 7 is a circuit diagram showing an actual example of the phase correction circuit.

FIG. 7 shows an actual example of a phase correction circuit, which includes a low pass filter composed of a resistor $R_{L.P.F.}$ having 22 K$\Omega$ and an inductor $L_{L.P.F.}$ having 330 mH and a high pass filter connected to the low pass filter and composed of a resistor $R_{H.P.F.}$ having 10 K$\Omega$ and an inductor $L_{H.P.F.}$ having 47 $\mu$ H.

Figure 8:
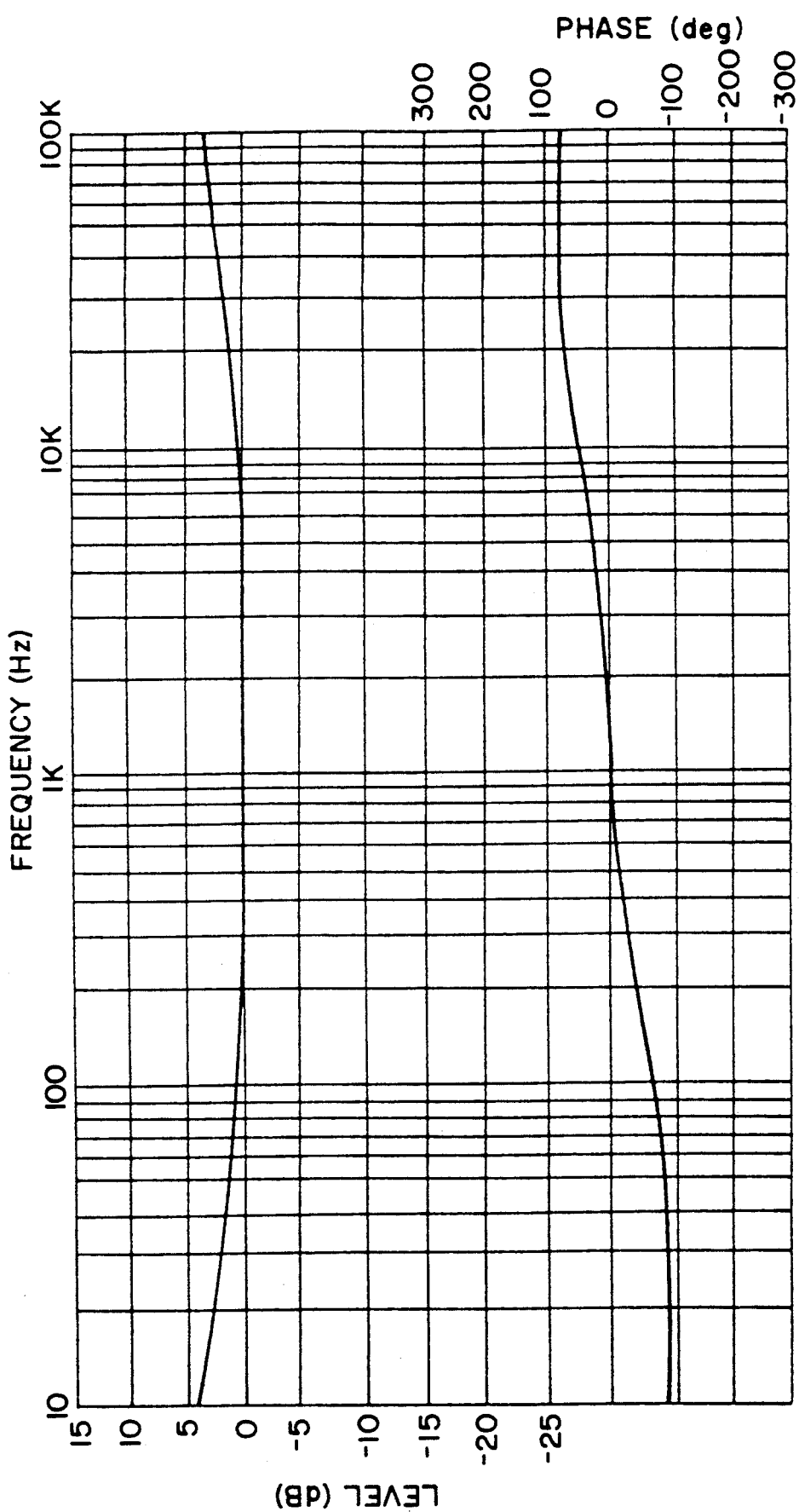
FIG. 8 is a characteristic diagram of an amplifier using the circuit of FIG. 7.

The frequency characteristic and the phase characteristic of the circuit is expressed as the characteristic diagram shown in FIG. 8 and satisfy the above characteristic.

More particularly, the frequency characteristic is gradually lowered from a low frequency to about 200 Hz when considering 1000 Hz as a reference and is gradually increased in the frequency higher than about 10 KHz. Further, the phase characteristic is delayed in the frequency lower than about 1000 Hz as the frequency is lowered when considering 1000 Hz as a reference and is advanced in the frequency higher than about 1000 Hz as the frequency is increased.

The similar characteristic can be attained even in the operational amplifier or other amplifier circuit. In this case, it is a matter of course that constants of circuit elements constituting the high pass filter and the low pass filter are determined to compensate for the phase characteristic of the amplifier.

Figure 9:
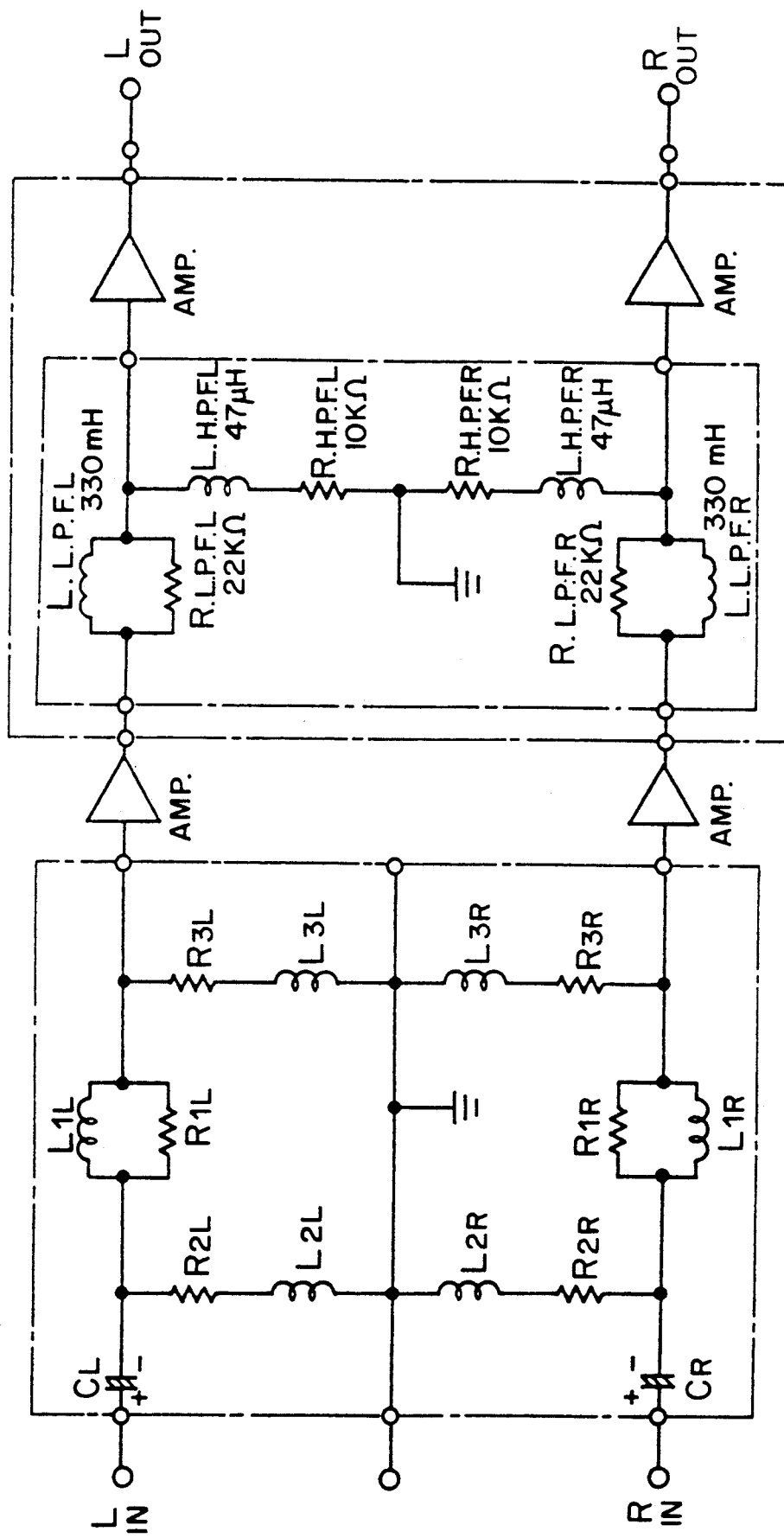
FIG. 9 is a circuit diagram according to the second invention.

The second invention includes the equalizer of the first invention connected to the preceding stage of the amplifier which is the above phase correction circuit. An actual example of the second invention is shown in FIG. 9. The configuration of the equalizer circuit and the determination of constants of circuit elements constituting the equalizer circuit conform to the first invention. The phase correction circuit uses the circuit shown in FIG. 7, while it is a matter of course that the circuit shown in FIGS. 5 and 6 or the circuit composed of an operational amplifier or other amplifier circuit having constants of circuit elements determined to compensate for the phase characteristic of the amplifier may be used.

Figure 10:
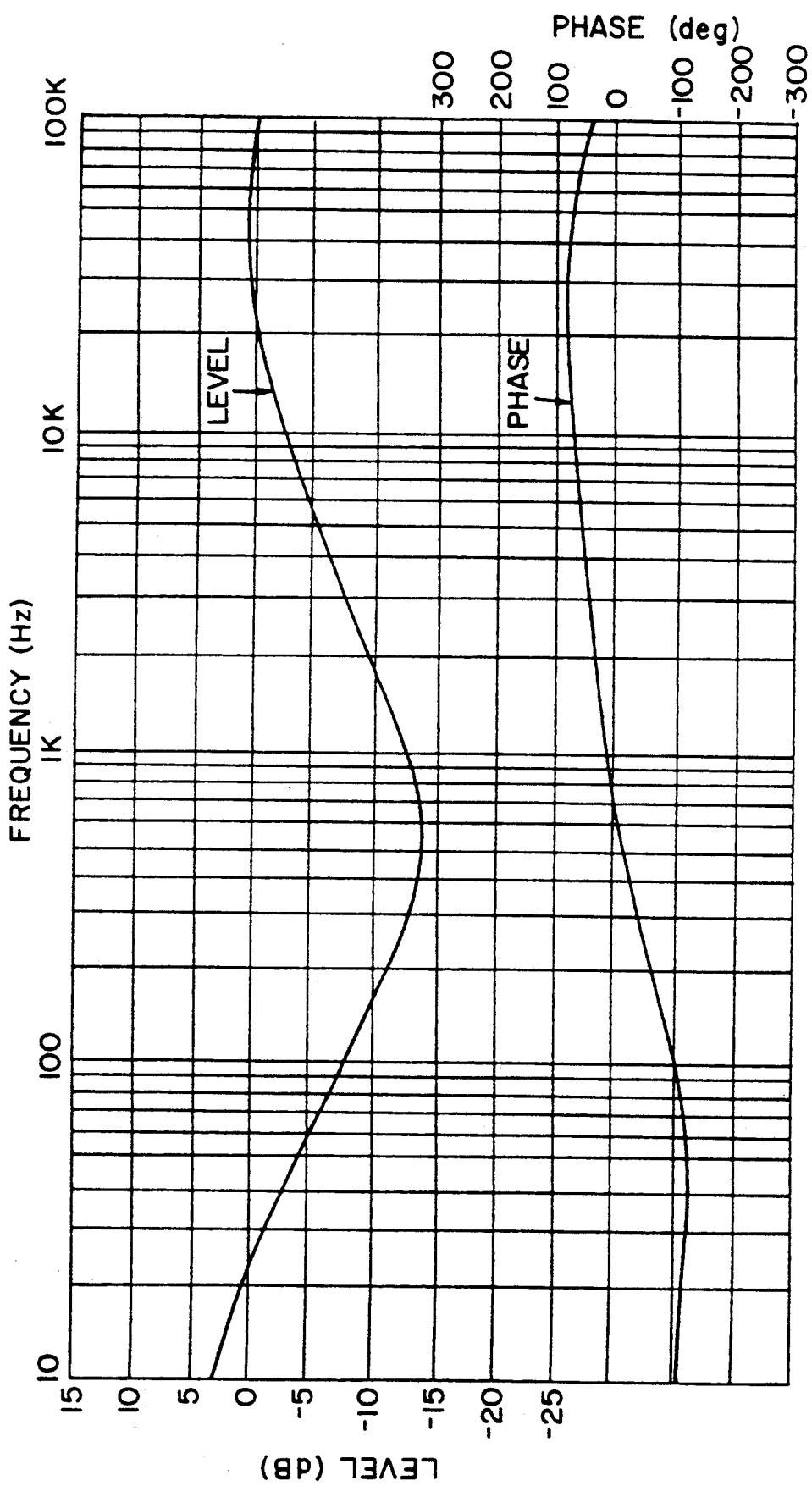
FIG. 10 is a characteristic diagram showing phase and frequency characteristics of the circuit shown in FIG. 9.
Figure 11:
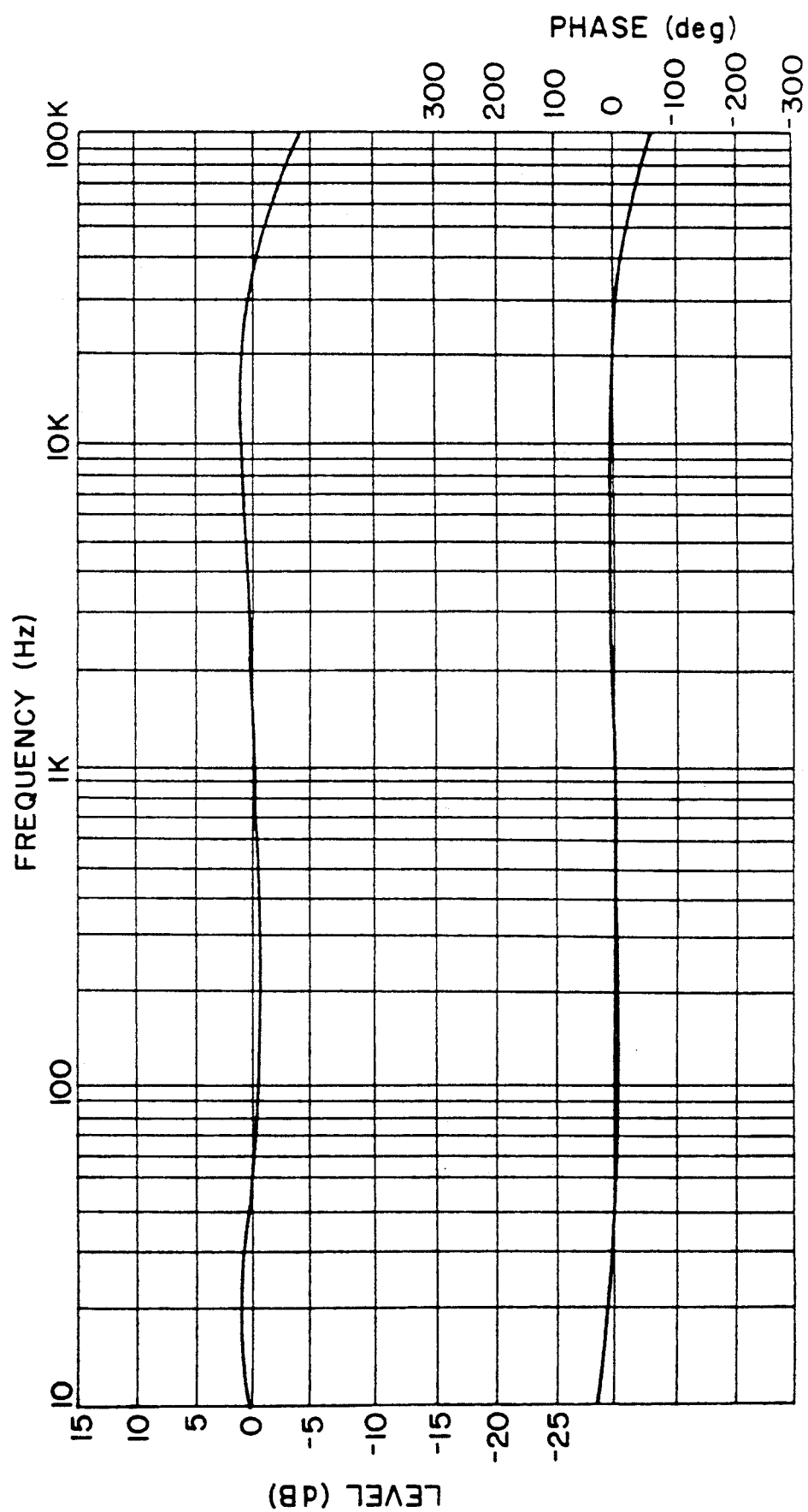
FIG. 11 is a characteristic diagram in the case where the second invention is applied to a general audio amplifier.

FIG. 10 shows a characteristic diagram of the circuit shown in FIG. 9. As apparent from the characteristic diagram of FIG. 10, the characteristics shown in FIG. 10 are substantially equal to a combination of the characteristics of the equalizer circuit shown in FIG. 3 and the characteristics of the phase correction circuit shown in FIG. 8. When the second invention is combined with a general amplifier, the characteristic diagram thereof is shown in FIG. 11. As apparent from the characteristic diagram shown in FIG. 11, the frequency characteristic and the phase characteristics thereof are flat over a wide frequency range.

In the embodiment, the equalizer circuit of the second invention is connected to the input of the phase correction circuit 1, while the equalizer circuit can be connected to the output or both of the input and output of the phase correction circuit 1.

Accordingly, according to the second invention, since the phase distortion is small and the phase characteristic and frequency characteristic of aural signal produced by the amplifier are flat over a wide frequency range, regenerated sound can be brought close to natural sound correspondingly.

FIGS. 12 to 16 show embodiments of an acoustic characteristic correction circuit according to a third invention.

Figure 12:
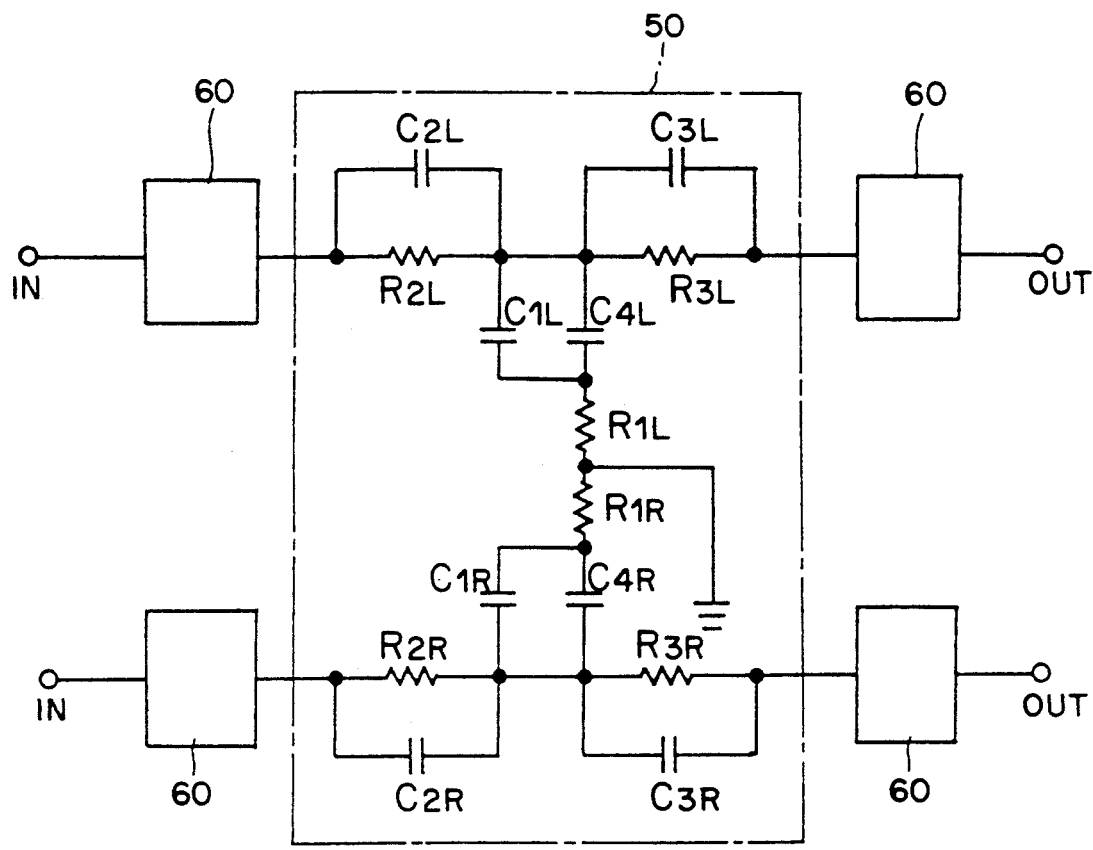
FIG. 12 is a circuit diagram according to a first embodiment of a third invention.
Figure 13:
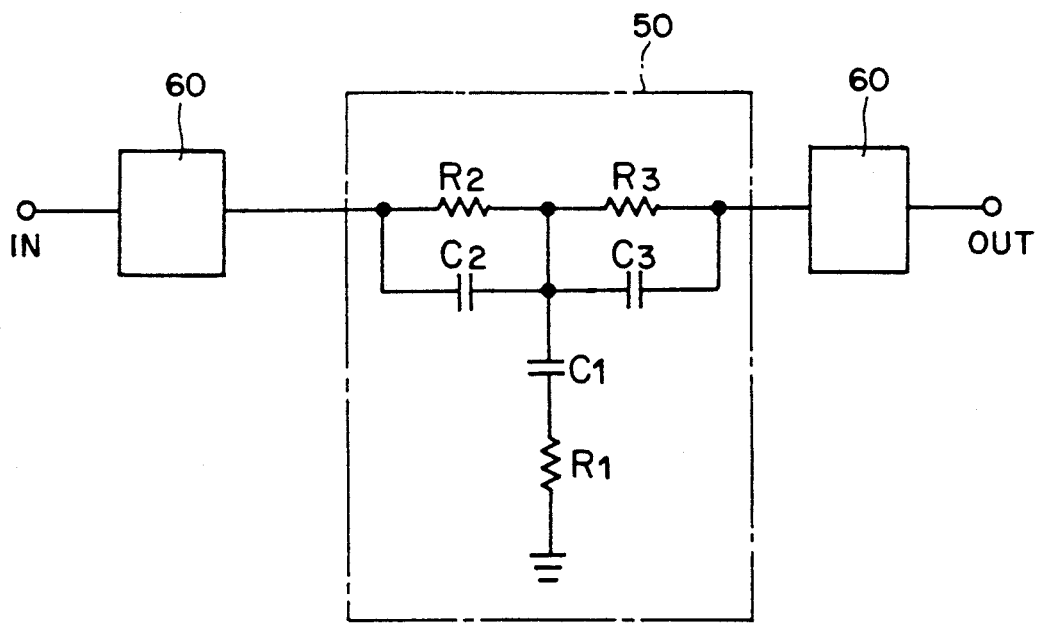
FIG. 13 is a schematic circuit diagram showing only one side of the circuit of FIG. 12.
Figure 14:
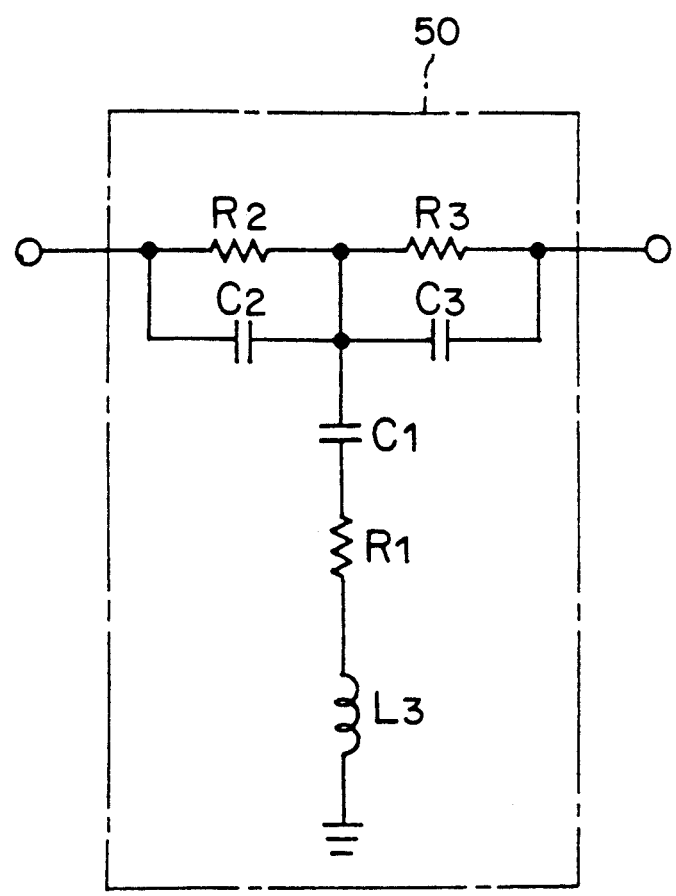
FIG. 14 is a schematic circuit diagram showing only one side of another example of the third invention.

FIGS. 12 to 14 show a first embodiment of the third invention and FIG. 12 shows a circuit diagram of the circuit.

The circuit includes an equalizer circuit 50 and impedance conversion circuits 60 connected in series to an input and/or output of the equalizer circuit 50. As shown in FIG. 12, the equalizer circuit 50 includes resistors and condensers. Parallel circuits of a condenser $C_{2L}$ and a resistor $R_{2L}$, and a condenser $C_{3L}$ and a resistor $R_{3L}$ constitute a left-hand high pass filter and parallel circuits of a condenser $C_{2R}$ and a resistor $R_{2R}$, and a condenser $C_{3R}$ and a resistor $R_{3R}$ constitute a right-hand high pass filter. Condensers $C_{1L}$, $C_{4L}$ and a resistor $R_{1L}$ constitute a left-hand low pass filter and condensers $C_{1R}$ and $C_{4R}$ and a resistor $R_{1R}$ constitute a right-hand low pass filter. Only one side of the circuit is shown in FIG. 13 equivalently. The resistor $R_1$ and the condenser $C_1$ constitute a low frequency correction circuit, the resistor $R_2$ and the condenser $C_2$ constitute a medium frequency correcting circuit, and the resistor $R_3$ and the condenser $C_3$ constitute a high frequency correction circuit. The high pass filter and the low pass filter are connected to each other and an end of the low pass filter is connected to ground. It is very important to determine constants of circuit elements constituting the equalizer circuit 50, while the determination of the constants conforms to the equalizer circuit of the first invention.

The impedance circuit 60 connected to the input and/or output of the equalizer circuit 50 is provided to exhibit the characteristic (described in the determination of the constant in the equalizer circuit of the first invention) of the equalizer circuit 50 sufficiently.

More particularly, the characteristic of the equalizer circuit 50 is shown in FIG. 3, while the equalizer circuit 50 has a delicate relation to the impedance of the circuit connected to the input or the output of the equalizer circuit 50 and the frequency characteristic and the phase characteristic thereof in the low frequency range or the high frequency range are affected by a value of the impedance. More particularly, there is no problem when the output impedance of the preceding stage (not shown) of the equalizer circuit 50 is smaller than the input impedance of the equalizer circuit 50, while when the output impedance is higher, the frequency level in the low frequency range is not increased sufficiently in the characteristic diagram shown in FIG. 3 and the phase characteristic in the low frequency range is not delayed sufficiently. Accordingly, the acoustic characteristic in the low frequency range is not exhibited. Further, there is no problem when the input impedance of the characteristic (not shown) of the equalizer circuit 50 is higher than the output impedance of the circuit 50, while when the input impedance is lower, the frequency level in the high frequency range is increased excessively in the characteristic diagram and the phase characteristic in the high frequency range is advanced excessively. Accordingly, in this case, the acoustic characteristic in the high frequency range is not exhibited. The impedance conversion circuit 60 serves to exhibit the acoustic characteristic in the low and high frequency ranges of the equalizer circuit 50 sufficiently. The impedeance conversion circuit 60 may be connected to any of the input and the output of the equalize circuit 50. The impedance conversion circuit 60 uses, for example, an emitter follower, an operational amplifier or the like.

Further, the equalizer circuit 50 can use an inductor $L_3$ at a part thereof as shown equivalently in FIG. 14, in which only one side is shown, in order to enhance the phase correction and correct the frequency characteristic. In this example, the inductor $L_3$ is used for the correction (enhancement) of the phase in the high frequency range. However, in this case, it is necessary to set a resonance frequency by the relation of the inductor and the circuit elements to the outside of the frequency band to be used.

Figure 15:
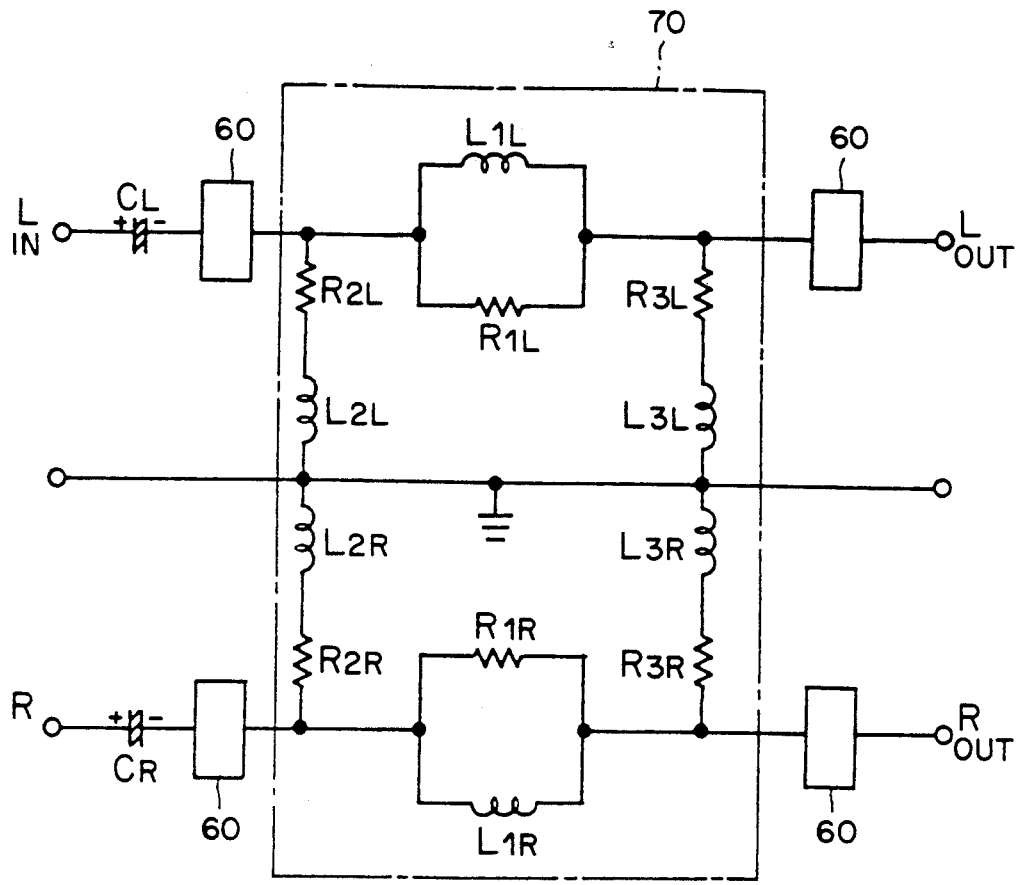
FIG. 15 is a circuit diagram according to a second embodiment of the third invention.
Figure 16:
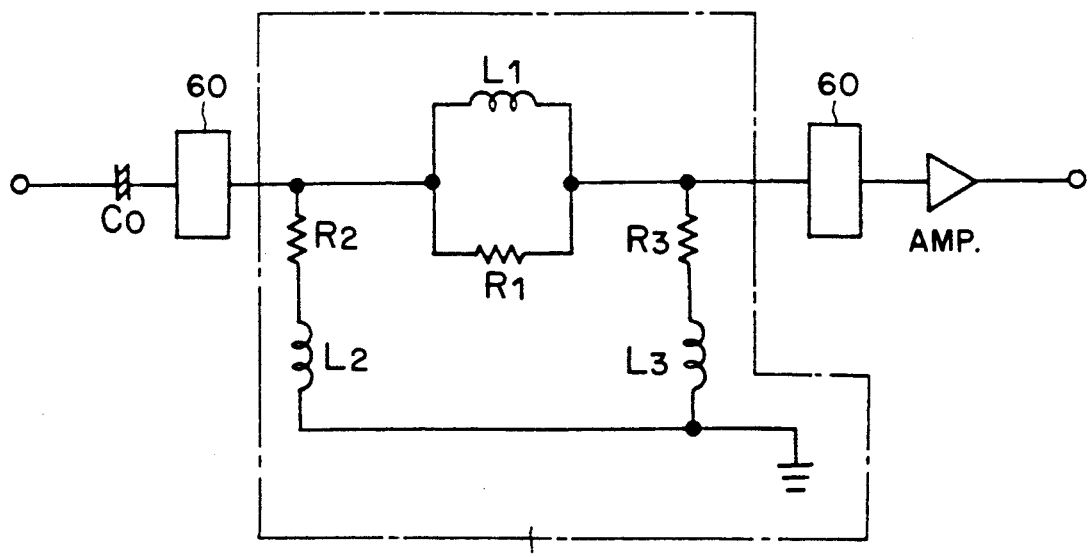
FIG. 16 is a schematic circuit diagram showing only one side of the circuit of FIG. 15.

FIGS. 15 and 16 show a second embodiment of the third invention is constituted of resistors and inductors connected to the resistors and conforms to the equalizer circuit (FIGS. 1 and 2) of the first invention. The determination of constants of circuit elements constituting the equalizer circuit 70 also conforms to the first invention. Other configuration is the same as that of the first embodiment. However, the acoustic characteristic correction in the low and high frequency ranges by the impedance conversion circuit 60 in the equalizer circuit 70 is slightly different from the case of the equalizer circuit 50, it serves to correct reduction of the higher frequency level in the characteristic diagram of FIG. 3 and at the same time to correct delay of the phase characteristic in the high frequency range when the input impedance of a subsequent circuit not shown of the equalizer circuit 70 is lower than the output impedance of the circuit 70.

Thus, according to the third invention, the acoustic characteristic in the low and high frequency ranges can be exhibited sufficiently in addition to the effect of the first invention and regenerated sound can be brought close to natural sound.

In the three inventions described above, each of the filters includes one resistor and one inductor (in the third invention, a resistor and a condenser or an inductor), while it is not limited thereto and it is a matter of course that an equalizer circuit (for example, a π-type connection or the like) constituted of a complicated circuit may be employed if it is equivalent to the circuit of the present invention. The equalizer circuit of the present invention can be applied to an audio amplifier usually employed in a room or an automobile or other various amplifiers.

Further, it is a matter of course that the inventions can be combined with each other.

As apparent from the above description, according to the equalizer circuit of the first invention, the phase distortion can be eliminated and regenerated sound can be brought close to natural sound.

According to the high fidelity regenerative amplifier of the second invention, since the phase characteristic and the frequency characteristic are flat over a wide frequency range in addition to the effects of the first invention, amplification in the low and high frequency ranges can be made and regenerated sound can be brought more close to natural sound.

Further, according to the acoustic characteristic correction circuit of the third invention, since the acoustic characteristic of the equalizer circuit in the low frequency range is exhibited sufficiently in addition to the effects of the first invention, regenerated sound can be brought close to natural sound even in the low and high frequency ranges.

The present inventions are employed in an audio circuit of a home stereo, a CD player, a record player, a tape player, an FM receiver (FM-detected audio), a loudspeaker or the like, and natural sound (original sound field) which can not be attained heretofore can be attained. With an FM car radio, sound can be heard in an automobile without fatigue feeling as in a broadcasting studio or a concert hall.

I claim:

1. An equalizer circuit for correcting the quality and a frequency characteristic of regenerated sound so that the regenerated sound in various sound fields can be obtained in a state near to original sound, comprises:
   a medium frequency and high frequency correction circuits made from passive circuit elements having a characteristic that a phase of an input aural signal advances as a frequency of the aural signal is increased in a higher frequency range than the vicinity of 1 KHz which comprises a resistor and an inductor connected in one of series or parallel connection and having a circuit constant with a reverse phase characteristic of the sound field to be regenerated which advances a phase of the frequency from about 1 KHz to 5 KHz relatively in order to attain far and near feeling, and a low frequency correction circuit made from passive circuit elements having a characteristic that a phase of the input aural signal is delayed as the frequency of the aural signal is lowered in a lower frequency range than about 1 KHz which comprises a resistor and an inductor connected in one of parallel or series connection and having a circuit constant having a reverse characteristic to a peak of a resonance frequency of the sound field to be regenerated, said medium, high and low frequency correction circuits being connected to one another.

2. A high fidelity regenerative amplifier comprising an amplifier circuit for amplifying regenerated sound with high fidelity, a phase correction circuit connected to an input of said amplifier circuit to correct a phase characteristic of said amplifier circuit over a wide frequency range, and an equalizer circuit connected to said phase correction circuit and including a medium frequency and high frequency correction circuits made from passive circuit elements having a characteristic that a phase of an input aural signal advances as a frequency of the aural signal is increased in a higher frequency range than the vicinity of 1 KHz which comprises a resistor and an inductor connected in one of series or parallel connection and having a circuit constant with a reverse phase characteristic of the sound field to be regenerated which advances a phase of the frequency from about 1 KHz to 5 KHz relatively in order to obtain far and near feeling, and a low frequency correction circuit having a characteristic that a phase of the input aural signal is delayed as the frequency of the aural signal is lowered in a lower frequency range than about 1 KHz which comprises a resistor and an inductor connected in one of parallel or series connection and having a circuit constant having a reverse characteristic to a peak of a resonance frequency of the sound field to be regenerated, said medium, high and low frequency correction circuits being connected to one another.

3. An acoustic characteristic correction circuit in a high fidelity regenerative amplifier, comprising an equalizer circuit for correcting the quality and a frequency characteristic of regenerated sound so that the regenerated sound in various sound field can be obtained in a state near to original sound and including a medium frequency and high frequency correction circuits having a characteristic that a phase of an input aural signal advances as a frequency of the aural signal is increased in a higher frequency range than the vicinity of 1 KHz which comprises a resistor and a condenser or an inductor connected in one of series or parallel connection and having a circuit constant with a reverse phase characteristic of the sound field to be regenerated which advances a phase of the frequency from about 1 KHz to 5 KHz relatively in order to obtain far and near feeling, and a low frequency correction circuit having a characteristic that a phase of the input signal is delayed as the frequency of the aural signal is lowered in a lower frequency range than about 1 KHz which comprises a resistor and a condenser or an inductor connected in one of parallel or series connection and having a circuit constant having a reverse characteristic to a peak of a resonance frequency of the sound field to be regenerated, said medium, high and low frequency correction circuits being connected with one another and an impedance conversion circuit connected to said equalizer circuit to convert an impedance of said equalizer circuit to a proper value.

* * * * *